United States Patent
Constant et al.

(10) Patent No.: US 10,790,374 B2
(45) Date of Patent: *Sep. 29, 2020

(54) METHOD FOR FORMING OHMIC CONTACTS

(71) Applicant: SEMICONDUCTOR COMPONENTS INDUSTRIES, LLC, Phoenix, AZ (US)

(72) Inventors: Aurore Constant, Oudenaarde (BE); Peter Coppens, Kanegem-Tielt (BE)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 0 days.

This patent is subject to a terminal disclaimer.

(21) Appl. No.: 16/017,145

(22) Filed: Jun. 25, 2018

(65) Prior Publication Data

US 2018/0308946 A1   Oct. 25, 2018

Related U.S. Application Data

(63) Continuation of application No. 15/289,519, filed on Oct. 10, 2016, now Pat. No. 10,032,880.

(51) Int. Cl.
*H01L 29/00* (2006.01)
*H01L 29/45* (2006.01)
(Continued)

(52) U.S. Cl.
CPC ........... *H01L 29/452* (2013.01); *H01L 21/18* (2013.01); *H01L 21/28575* (2013.01);
(Continued)

(58) Field of Classification Search
None
See application file for complete search history.

(56) References Cited

U.S. PATENT DOCUMENTS

| 7,214,325 B2 | 5/2007 | Lee et al. |
| 7,719,030 B2 | 5/2010 | Herman |

(Continued)

FOREIGN PATENT DOCUMENTS

| CN | 100485886 A | 2/2006 |
| EP | 2806463 A1 | 11/2014 |

OTHER PUBLICATIONS

Motayed et al., Electrical, thermal, and microstructural characteristics of Ti/Al/Ti/Au multilayer Ohmic contacts to n-type GaN, Jan. 2003, Journal of Applied Physics, vol. 93 No. 2, pp. 1087-1094. (Year: 2003).*

(Continued)

*Primary Examiner* — Reema Patel
(74) *Attorney, Agent, or Firm* — Adam R. Stephenson, Ltd.

(57) ABSTRACT

Implementations of an ohmic contact for a gallium nitride (GaN) device may include: a first layer including aluminum coupled directly with the GaN device; the GaN having a heterostructure with an undoped GaN channel and a semi-insulating aluminum gallium nitride (AlGaN) barrier, all the foregoing operatively coupled with a substrate; a second layer including titanium coupled over the first layer; and a third layer including an anti-diffusion material coupled with the second layer. A passivation layer may be coupled between the AlGaN barrier and the first layer of the ohmic contact. The passivation layer may surround the ohmic contact.

20 Claims, 13 Drawing Sheets

(51) Int. Cl.
　　　H01L 23/29　　　(2006.01)
　　　H01L 21/18　　　(2006.01)
　　　H01L 21/285　　(2006.01)
　　　H01L 23/31　　　(2006.01)
　　　H01L 29/20　　　(2006.01)
　　　H01L 29/205　　(2006.01)
　　　H01L 29/778　　(2006.01)
(52) U.S. Cl.
　　　CPC ........ *H01L 23/291* (2013.01); *H01L 23/3171* (2013.01); *H01L 29/2003* (2013.01); *H01L 29/205* (2013.01); *H01L 29/7787* (2013.01); *H01L 29/7786* (2013.01)

(56) References Cited

U.S. PATENT DOCUMENTS

| | | | |
|---|---|---|---|
| 10,032,880 B2* | 7/2018 | Constant | ............... H01L 23/291 |
| 2003/0201459 A1 | 10/2003 | Sheppard | |
| 2006/0006414 A1 | 1/2006 | Germain | |
| 2012/0007101 A1* | 1/2012 | Yang | ................... H01L 33/0079 257/76 |
| 2014/0234996 A1 | 8/2014 | Hu et al. | |
| 2014/0252390 A1* | 9/2014 | Yoon | ....................... H01L 33/60 257/98 |
| 2014/0346568 A1 | 11/2014 | De Jaeger et al. | |

OTHER PUBLICATIONS

M. Abraham et al., "Extreme sensitivity of contact resistance to variations in the interfacial composition of Ti/Al-based contacts to N-face GaN/AlGaN heterostructures", Applied Physics Letters, vol. 101, 243504 (2012).

H. Tokuda et al., "Role of Al and Ti for ohmic contact formation in AlGaN/GaN heterostructures", Applied Physics Letters, vol. 101, 262104 (2012).

Lee, Hyung-Seok et. al., AlGaN/GaN High-Electron-Mobility Transistors Fabricated Through a Au-Free Technology, IEEE Electron Device Letters, vol. 32, Issue 5, pp. 623-625, May 2011.

Firrincieli, Andrea, et. al., Au-free low temperature ohmic contacts for AlGaN/GaN power devices on 200 mm Si substrates, Japanese Journal of Applied Physics, Valume 53, No. 4S, Feb. 3, 2014.

Jaeger, B. De, et. al., Au-free CMOS-compatible AlGaN/GaN HEMT processing on 200 mm Si substrates, IEEE, Power Semiconductor Devices and ICs (ISPSD), 2012.

Jia, Lifang, et. al., AlGaN/GaN Schottky Diode Fabricated by Au Free Process, IEEE Electron Device Letters, vol. 34, Issue 10, pp. 1235-1237, Oct. 2013.

Liu, Zhihong, et. al., AlGaN/AlN/GaN High-Electron-Mobility Transistors Fabricated with Au-Free Technology, Applied Physics Express, vol. 6, No. 9, Aug. 2013.

Daele, B. Van, et. al., The role fo Al on Ohmic contact formation o nn-type GaN and AlGaN/GaN, Applied Physics Letters, 87, 061905 (2005).

Greco, G. et. al., Nanoscale structural and electrical evolution of Ta-and Ti-based contacts on AlGaN/GaN heterostructures, Journal of Applied Physics, 114, 083717 (2013).

Huang, Huolin, et. al., Au-Free Normally-Off AlGaN/GaN-on-Si MIS-HEMTs Using Combined Partially Recessed and Fluorinated Trap-Charge Gate Structures, IEEE Electron Device Letters, vol. 35, Issue 5, pp. 569-571, May 2014.

Van Hove, Marleen, et. al., Fabrication and Perfomance of Au-Free AlGaN/GaN-on-Silicon Power Devices With Al2O3 and SicN4/Al2O3 Gate Dielectrics, IEEE Transaction on Electron Devices Voume 60, Issue 10, pp. 3071-3078, Oct. 2013.

* cited by examiner

METHOD FOR FORMING OHMIC CONTACTS

CROSS REFERENCE TO RELATED APPLICATIONS

This application is a continuation application of the earlier U.S. Utility patent application to Constant entitled "Method for Forming Ohmic Contacts," application Ser. No. 15/289,519, filed Oct. 10, 2016, now pending, the disclosure of which is hereby incorporated entirely herein by reference.

BACKGROUND

1. Technical Field

Aspects of this document relate generally to ohmic contacts.

2. Background

An ohmic contact is a low resistance junction that provides current from a metal layer to a semiconductor layer. The electrical behavior of an ohmic contact is that the current transported through the contact increases or decreases linearly with respect to the applied voltage.

SUMMARY

Implementations of an ohmic contact for a gallium nitride (GaN) device may include: a first layer including aluminum coupled directly with the GaN device; the GaN having a heterostructure with an undoped GaN channel and a semi-insulating aluminum gallium nitride (AlGaN) barrier, all the foregoing operatively coupled with a substrate; a second layer including titanium coupled over the first layer; and a third layer including an anti-diffusion material coupled with the second layer. A passivation layer may be coupled between the AlGaN barrier and the first layer of the ohmic contact. The passivation layer may surround the ohmic contact.

Implementations of ohmic contacts may include one, all, or any of the following:

The passivation layer may be at least one of silicon nitride ($Si_3N_4$), GaN, silicon dioxide ($SiO_2$), aluminum oxide ($Al_2O_3$), hafnium oxide ($HfO_2$), aluminum nitride (AlN) or any combination thereof.

The AlGaN barrier may be between 20% and 35% Al and include a thickness between 10 nm and 40 nm.

The ohmic contact may be formed by one of: etching through the passivation layer; etching through the passivation layer and etching partly through the AlGaN barrier; etching through the passivation layer and etching fully through the AlGaN barrier; or any combination thereof.

The first layer may include one of elemental Al, aluminum copper (AlCu), aluminum silicon copper (AlSiCu), aluminum silicon (AlSi), aluminum copper tungsten (AlCuW), or any combination thereof.

The amount of trace elements in the first layer may be less than 5%.

The amount of any trace elements in the first layer may be between 0.5% and 1%.

The first layer may include a thickness between 50 nm and 300 nm.

The second layer may have a thickness between 20 nm and 100 nm.

A ratio of the thicknesses of the first layer and the second layer may be lower than 3:1, respectively.

The third layer may include one of titanium nitride (TiN), tungsten (W), vanadium (V), platinum (Pt), molybdenum (Mo), nickel (Ni), or any combination thereof.

The ohmic contact may further include a fourth layer coupled between the second layer and the third layer where the fourth layer may include one of elemental Al, aluminum copper (AlCu), aluminum silicon copper (AlSiCu), aluminum silicon (AlSi), aluminum copper tungsten (AlCuW), or any combination thereof.

The first layer may have a thickness greater than 5 nm.

A combined thickness of the thickness of the first layer and a thickness of the fourth layer may be between 50 nm and 300 nm.

A ratio of the combined thicknesses of the first layer and the fourth layer and the thickness of the second layer may be less than 3:1, respectively.

Implementations of an ohmic contact for a gallium nitride (GaN) device may include: a first layer including aluminum coupled directly with the GaN device; the GaN device including a heterostructure with an undoped GaN channel and a semi-insulating aluminum gallium nitride (AlGaN) barrier; a second layer including titanium coupled over the first layer; a third layer including an anti-diffusion material coupled over the second layer, the anti-diffusion material including one of titanium nitride (TiN), tungsten (W), vanadium (V), platinum (Pt), molybdenum (Mo), nickel (Ni) or any combination thereof; and a fourth layer including aluminum coupled between the second layer and the third layer. A passivation layer may be coupled between the AlGaN barrier and the first layer of the ohmic metal stack. The passivation layer may surround the ohmic contact.

Implementations of ohmic contacts may include one, all, or any of the following:

The second layer may have a thickness between 20 nm and 100 nm.

A combined thickness of the thickness of the first layer and a thickness of the fourth layer may be between 50 nm and 300 nm.

A ratio of the combined thickness of the first layer and the fourth layer and the thickness of the second layer may be less than 3:1, respectively.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended ohmic contacts for gallium nitride (GaN) devices will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such ohmic contacts and implementing components and methods, consistent with the intended operation and methods.

Figure 1A:
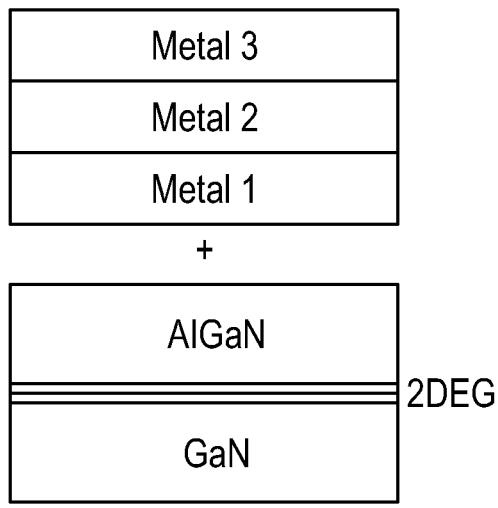
FIG. 1A is a schematic of an ohmic contact illustrating a general configuration of metals.
Figure 1B:
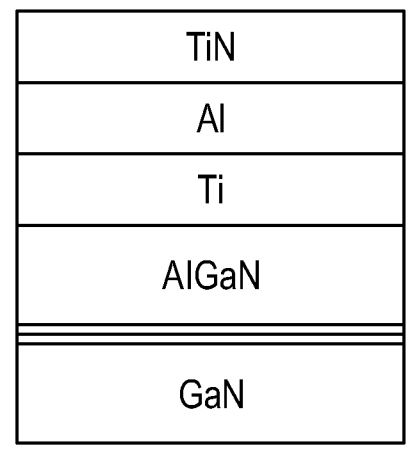
FIG. 1B is a schematic of a conventional ohmic contact illustrating a specific configuration of metals.
Figure 3:
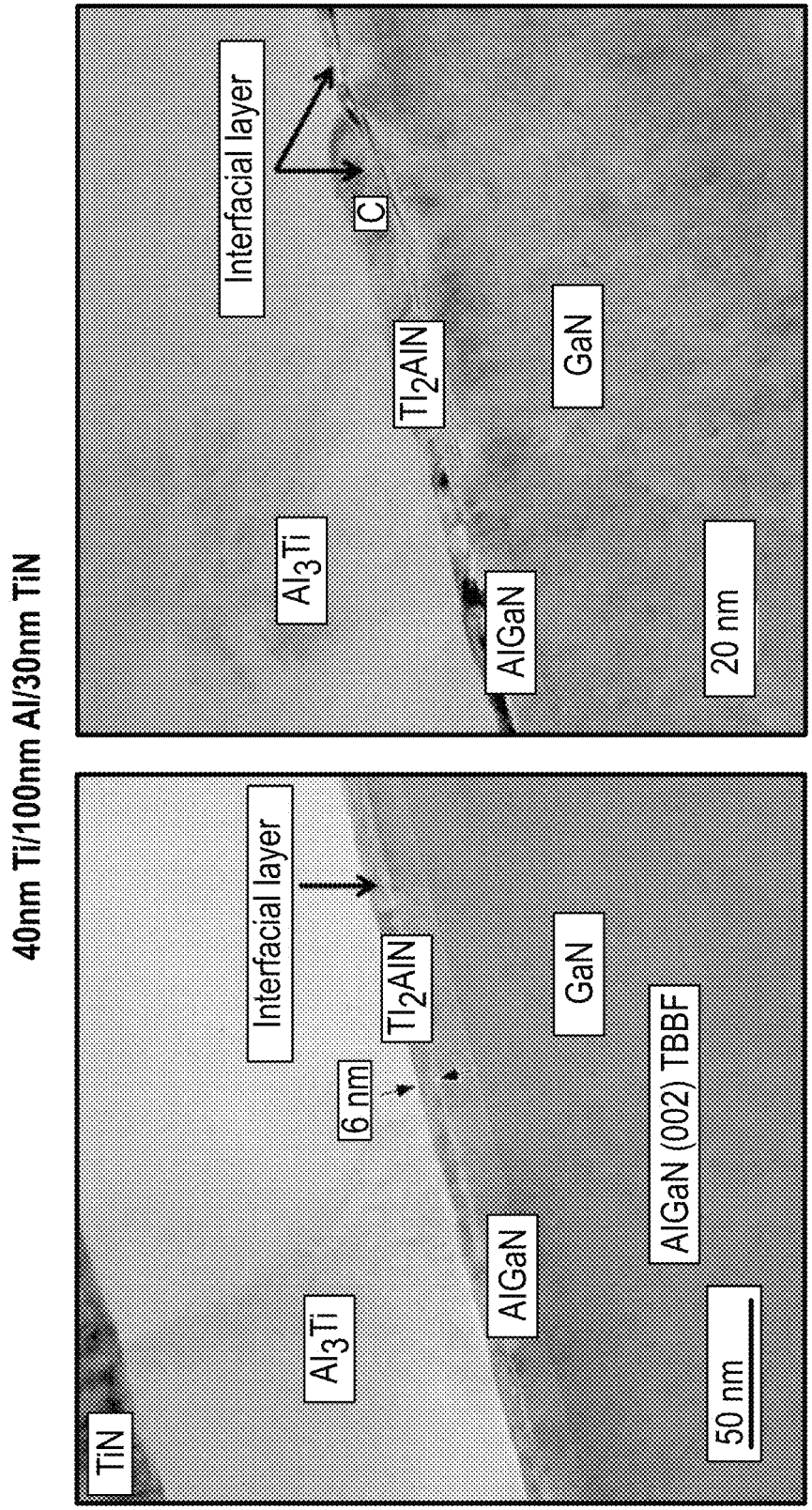
FIG. 3 shows cross sectional transmission electron microscopy images of the conventional ohmic contact configuration.
Figure 4A:
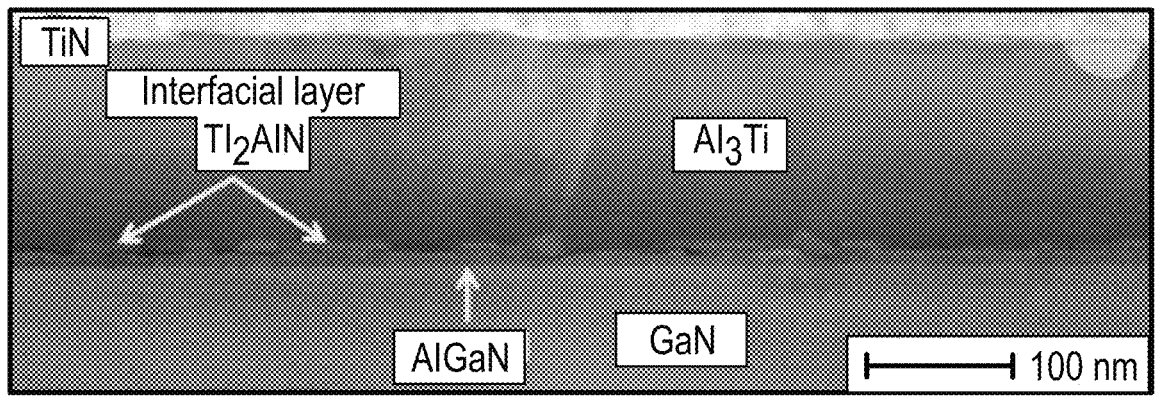
FIGS. 4A-4C show cross sectional transmission electron microscopy images of an implementation of an ohmic contact with a configuration of metals like that disclosed herein.
Figure 4B:
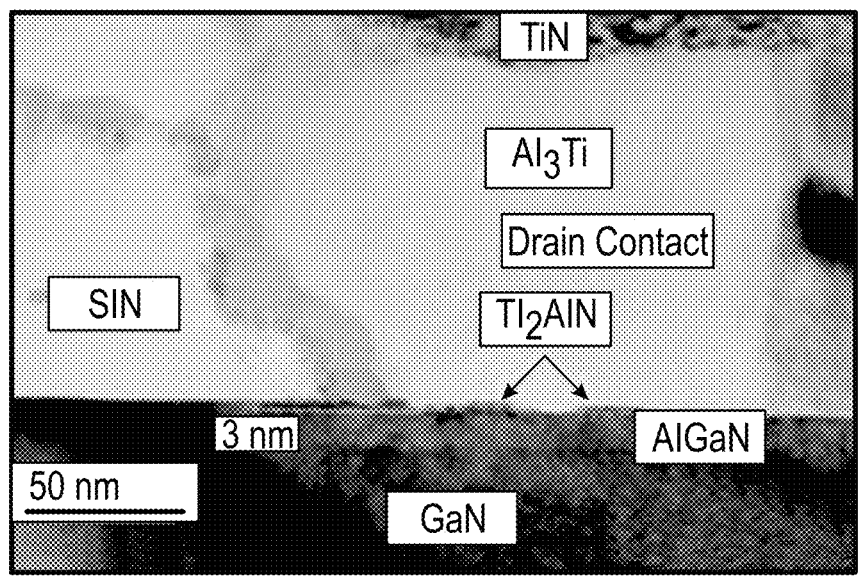
Figure 4C:
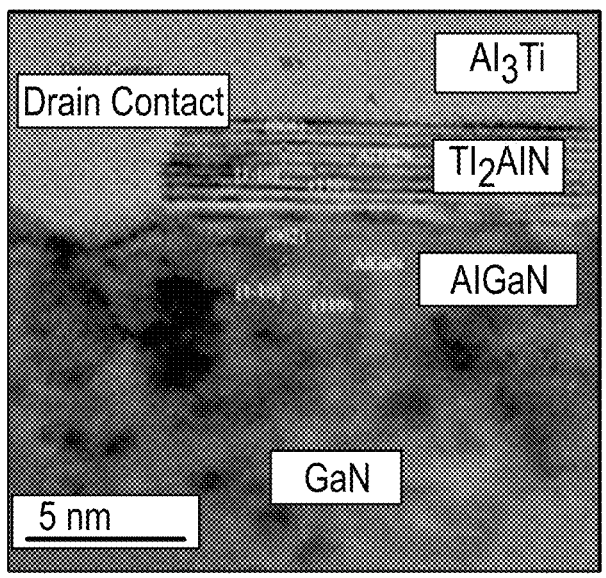
Figure 17:
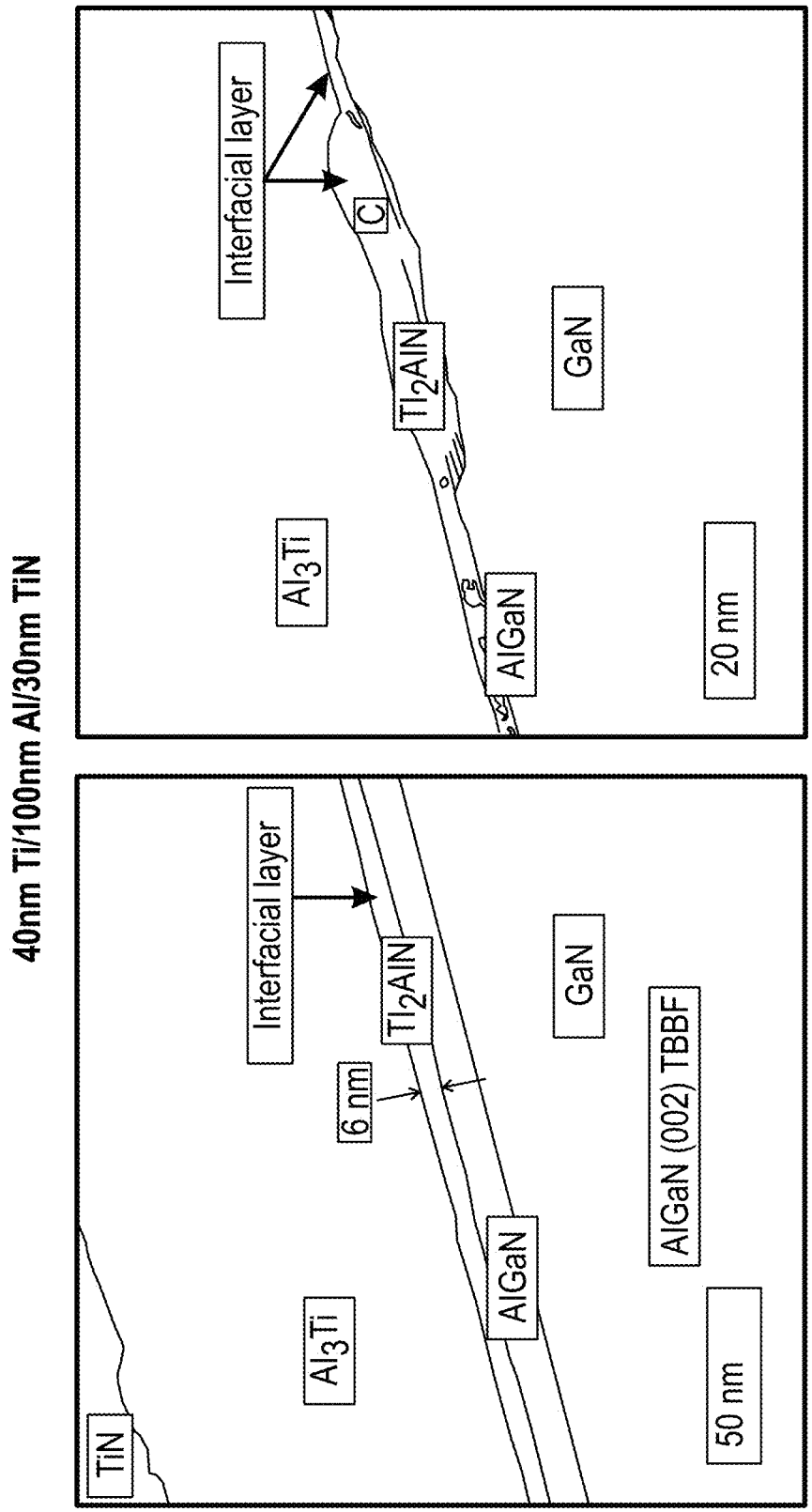
FIG. 17 is a line drawing of FIG. 3.

Referring to FIG. 1B, a conventional metallization scheme for gold free ohmic contacts on an aluminum gallium nitride/gallium nitride (AlGaN/GaN) heterostructure are illustrated. Conventional ohmic contacts on aluminum gallium nitride (AlGaN)/gallium nitride (GaN) heterostructures are based on an aluminum titanium (AlTi) stack with Ti as a barrier layer and Al as the main conductor. The barrier layer is used to keep the conductive layer from reacting with the heterostructure. In FIG. 1A, a general metallization scheme is illustrated. Metal 1 is typically a very low work function and very reactive metal. Metal 2 is a low work function and very conductive metal. Metal 3 is an anti-reflecting, anti-oxidation, and/or anti-diffusion metal. Few metallization schemes have been reported showing stable ohmic contact formation and achieving ohmic contact resistance below 1 Ohm·mm. In FIG. 1B, a conventional ohmic contact having the conventional metallization scheme with titanium as the barrier layer between the aluminum titanium (Al/Ti) stack and the heterostructure is illustrated. As illustrated in FIG. 3 and FIG. 17, the metal configuration of FIG. 1B creates a nearly continuous layer of titanium aluminum nitride ($Ti_2AlN$) having a resistance around 32 uOhm·cm above the AlGaN layer. The formation of this highly resistive layer is difficult to control and creates a minimum threshold resistance of 0.4-0.5 Ohm·mm for a conventional ohmic contact.

Figure 2:
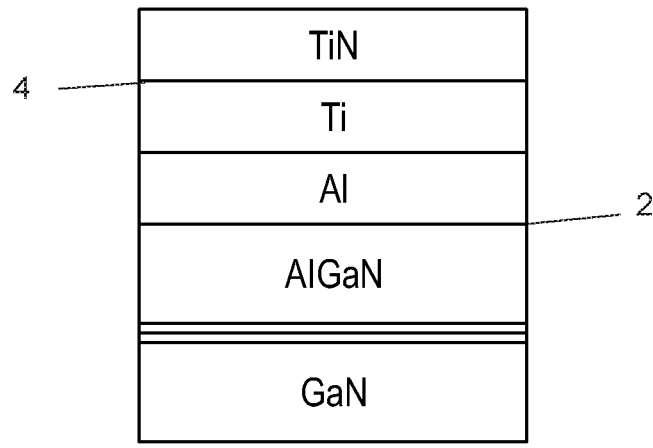
FIG. 2 is a schematic of an implementation of an ohmic contact illustrating a configuration of metals according to that disclosed in this document.

Referring to FIG. 2, an implementation of an ohmic contact like those disclosed herein is illustrated. This implementation of an ohmic contact for a GaN device includes a first layer having Al coupled directly with the GaN device, a second layer including Ti coupled over the first layer, and a third layer including an anti-diffusion material coupled with the second layer. The GaN device, in various implementations, may include a heterostructure with an undoped GaN channel and a semi-insulating epi buffer. In various implementations the semi-insulating buffer may be grown under the GaN channel. The buffer may include AlGaN. In various implementations the buffer may be a stepped graded AlGaN buffer (stepped meaning varying Al concentration in steps), a superlattice buffer structure, which contains many (50-150) repeating thin layers of AlGaN and GaN, any combination thereof, or any method known in the art. The GaN device, in various implementations, may also be operatively coupled with a substrate. A passivation layer 2 may be coupled between the AlGaN barrier and the first layer of the ohmic contact and may surround the ohmic contact. As can be seen from FIG. 2, this implementation uses an ohmic contact stack created by depositing the aluminum directly on the AlGaN of the heterostructure which is the opposite of the conventional method which has Ti between the Al and the AlGaN layer of the device. The placement of the Al layer directly on the AlGaN produces ohmic contacts with unexpectedly superior properties to those made using the conventional metal stack illustrated in FIG. 1B.

The devices described herein can be formed using the methods known in the art such as physical vapor deposition (PVD), chemical vapor deposition (CVD), evaporation, sputtering, molecular beam epitaxy, and atomic layer deposition (ALD). The GaN device may include a passivation layer formed on top of an AlGaN/GaN heterostructure with an undoped GaN channel layer on top of a semi-insulating AlGaN buffer all grown on a substrate. The substrate may be silicon (Si), molybdenum (Mb), silicon carbon, (SiC), aluminum oxide ($Al_2O_3$), aluminum nitride (AlN), or any suitable material known in the art. The AlGaN barrier may include between about 20% and about 35% Al. In various implementations, the AlGaN barrier may have a thickness between about 10 nm and about 40 nm. The undoped channel may include a two-dimensional-electron-gas (2-DEG) formed in the AlGaN/GaN heterostructure. The channel may have a thickness between about 300 nm and about 1000 nm. The passivation layer may include one of silicon nitride ($Si_3N_4$), GaN, silicon dioxide ($SiO_2$), $Al_2O_3$, hafnium oxide ($HfO_2$), aluminum nitride (AlN), any other suitable materials known in the art, and any combination thereof.

The ohmic contacts may be formed in various ways. In some implementations, the contacts are formed by etching through the passivation layer. In others, the contacts are formed by etching through the passivation layer and etching partly through the AlGaN barrier. In still other implementations the contacts are formed by etching through the passivation layer and etching fully through the AlGaN barrier. Various combinations of these techniques may also be used to form the contacts in various implementations. The first layer of the ohmic contact may include a wide variety of aluminum-containing compounds, including, by non-limiting example, elemental Al, aluminum copper (AlCu), aluminum silicon copper (AlSiCu), aluminum silicon (AlSi), aluminum copper tungsten (AlCuW), and other aluminum-containing materials. In various implementations, the trace elements in the first layer, meaning those that differ in type from the majority components in the material, may be less than about 5%. In particular implementations, the trace elements in the first layer may range between about 0.5% to about 1%. The thickness of the first layer may be between about 50 nm and about 300 nm in various implementations. In particular implementations, the thickness of the first layer may be about 100 nm. The second layer of the ohmic contact may have a thickness between about 20 nm and about 100 nm in various implementations. In particular implementations, the thickness of the second layer may be about 40 nm. In various implementations, the ratio of the thickness of the first layer to the thickness of the second layer may be less than 3:1, respectively. Other ratios may be used in other implementations, however. In various implementations, the third layer of the ohmic contact may include, by non-limiting example, titanium nitride (TiN), tungsten (W), vanadium (V), platinum (Pt), molybdenum (Mo), nickel and various combinations thereof.

In various implementations, the metal layers are annealed to ensure intimate contact between the AlGaN and the layers of the ohmic contact is created. In various implementations, the ohmic contact may be annealed at a temperature between about 700° C. and about 1000° C. In particular implementations, the annealing temperature may be about 850° C. Various ohmic contact implementations are annealed for between about 15 to about 300 seconds. In particular implementations, the annealing may take place for about 90 seconds.

Another implementation of an ohmic contact like those disclosed herein may include a fourth layer 4 coupled between the second layer and the third layer. The material of the fourth layer 4 may include by non-limiting example, elemental Al, AlCu, AlSiCu, AlSi, AlCuW, any combination thereof, or any other aluminum-containing material. In such implementations, the first layer may have a thickness greater than 5 nm and a combined thickness of the first layer and a thickness of the fourth layer may be between about 50 nm and about 300 nm. In various implementations, the ratio of the combined thicknesses of the first layer and the fourth layer and the thickness of the second layer may be less than 3:1, respectively. However, in other implementations, other ratios between the combined first and forth layer thickness and the thickness of the second layer may be employed. Implementations of ohmic contacts including a fourth layer may be annealed at a temperature between about 700° C. and about 1000° C. In particular implementations, the annealing may be carried out at about 850° C. The various implementations may be annealed for about 15 to about 300 seconds. Specific implementations may be annealed for about 90 seconds.

An alternative implementation of the metal stacks disclosed herein includes a fourth layer including aluminum. Specifically, the ohmic contact includes a first layer including aluminum coupled directly with the GaN device, a second layer including titanium coupled over the first layer; a third layer including an anti-diffusion material coupled over the second layer and a fourth layer including aluminum coupled between the second layer and the third layer.

As illustrated in FIGS. 4A-4C and FIGS. 18A-18C, the formation of the ohmic stack results in formation of a non-continuous/discontinuous interfacial layer of $Ti_2AlN$ during processing. As will be described in greater detail below, as a result, the configurations disclosed herein greatly reduce the ohmic contact resistance on the AlGaN/GaN heterostructures while the ohmic contact resistance remains stable wafer-to-wafer and run-to-run.

Figure 18A:
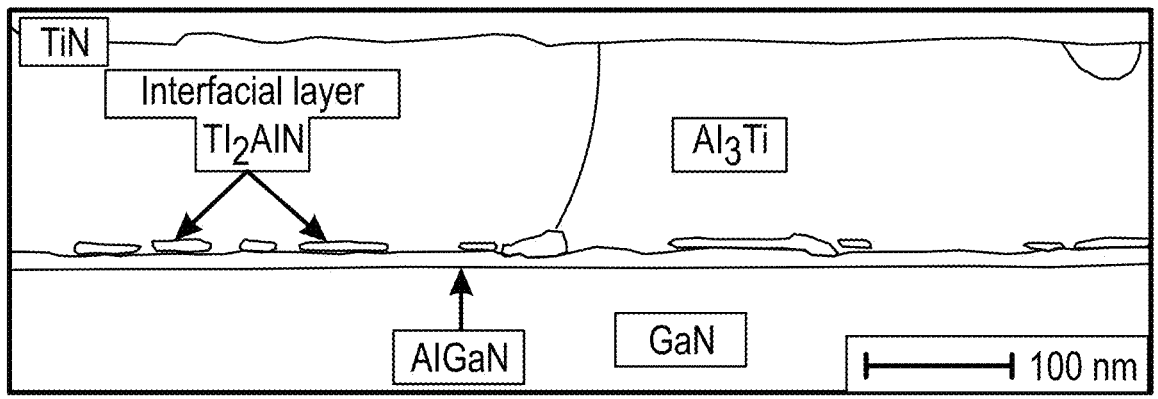
FIGS. 18A, 18B and 18C are line drawings of FIGS. 4A, 4B and 4C, respectively.
Figure 18B:
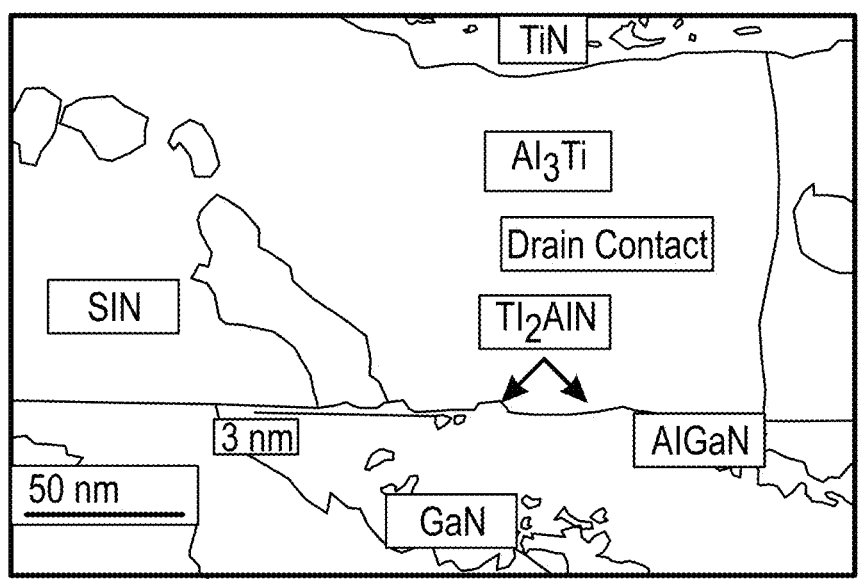
Figure 18C:
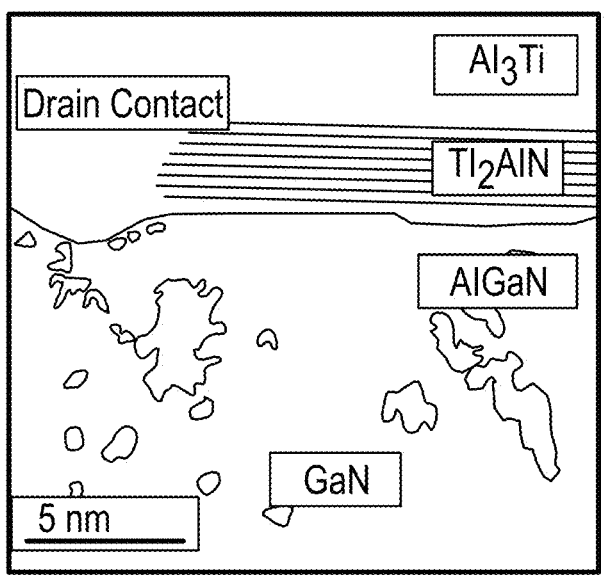

Referring again to FIG. 3, transmission electron microscopy (TEM) images illustrate a cross sectional view of a conventional ohmic contact formed with 40 nm Ti, 100 nm Al and 30 nm TiN. FIG. 17 is a line drawing representation of FIG. 3. The images show a conducting layer made of $Al_3Ti$ with an interfacial layer of $Ti_2AlN$ suggesting a strong reaction has occurred between the metal layers and the AlGaN. The interfacial layer is 6-15 nm thick and more than 90% continuous across the ohmic contact. In contrast, referring to FIGS. 4A-4C, TEM images of an implementation of an ohmic contact is illustrated with 100 nm Al/40 nm Ti/30 nm TiN. FIGS. 18A-18C are line drawing representations of FIGS. 4A-4C, respectively. The $Al_3Ti$ phase is still observed with a $Ti_2AlN$ interfacial layer present. However, unlike the conventional configuration shown in FIG. 3 and FIG. 17, surprisingly the interfacial layer is non-continuous/discontinuous suggesting a less strong reaction between the Ti layer and the AlGaN layer has occurred due to the placement of the Al layer directly over the AlGaN layer.

Figure 5:
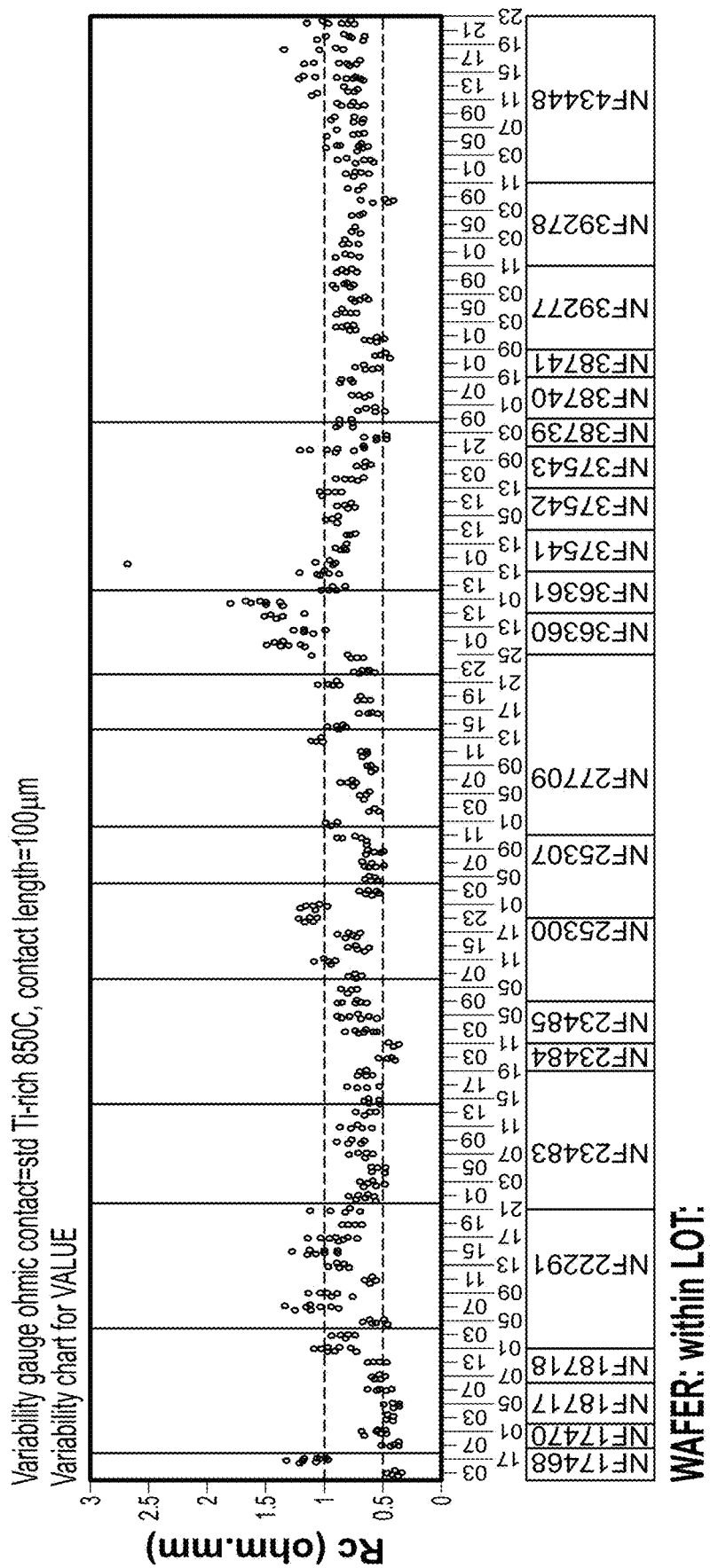
FIG. 5 is a graph illustrating the resistance of conventional ohmic contacts (100 µm length) across several lots of semiconductor wafers.
Figure 6:
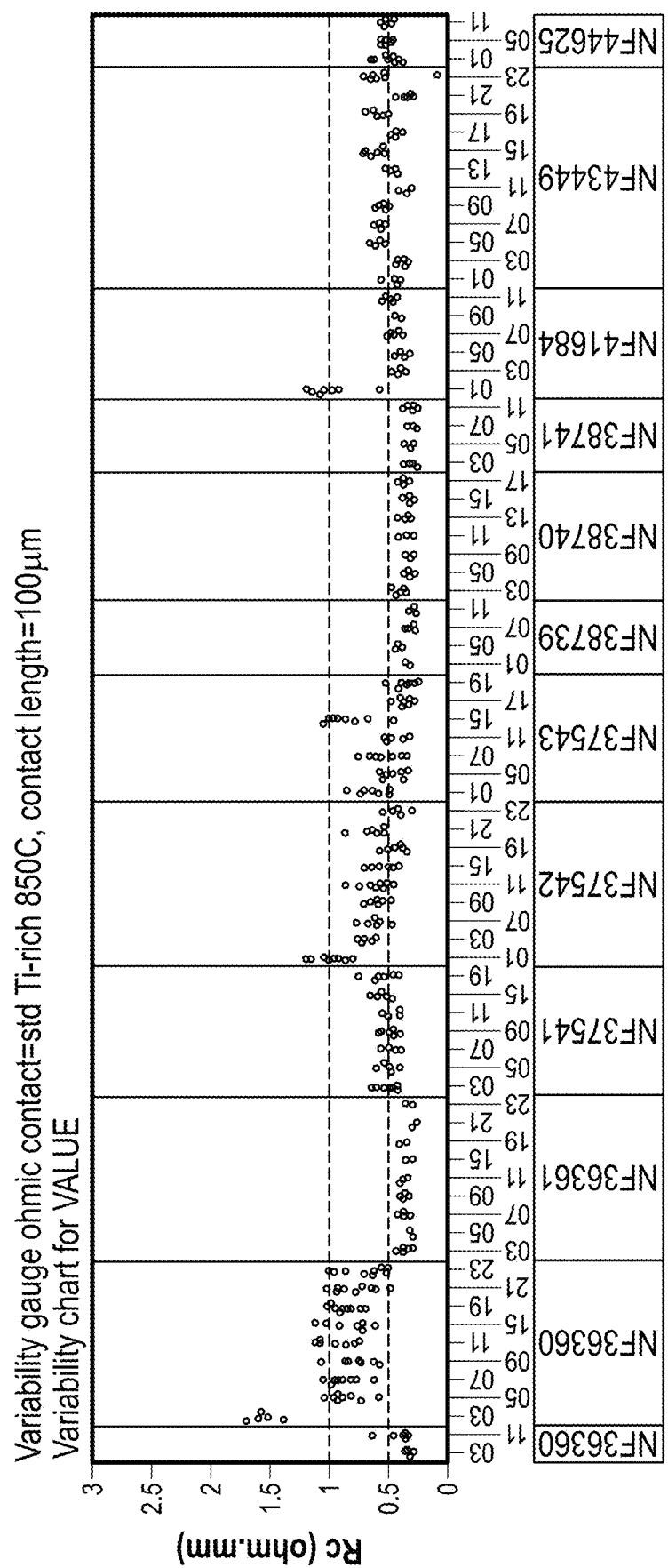
FIG. 6 is a graph illustrating the resistance of an implementation of ohmic contacts (100 µm length) formed using the metal configurations disclosed herein across several lots of semiconductor wafers.
Figure 7:
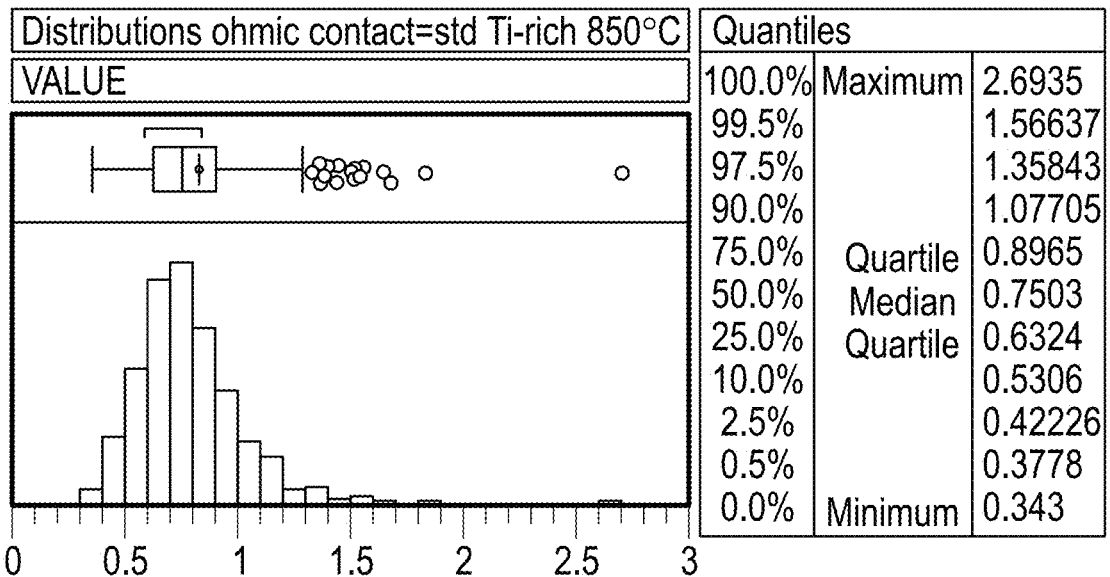
FIG. 7 is a histogram of the graph in FIG. 5.
Figure 8:
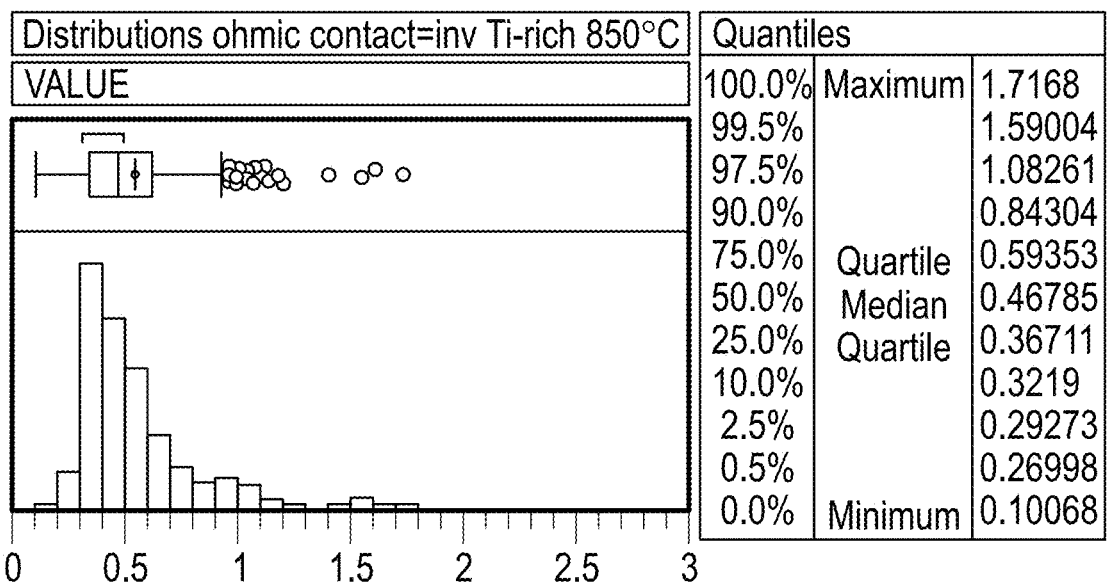
FIG. 8 is a histogram of the graph in FIG. 6.

Referring to FIGS. 5 and 6, graphs of the contact resistance ($R_c$) of 100 μm length ohmic contacts by wafer within lots is illustrated. The resistance of conventional (std) ohmic contacts is illustrated in FIG. 5 and the resistance of ohmic contacts like those disclosed herein is illustrated in FIG. 6. Referring to FIGS. 7 and 8, histograms of the wafer-level data in the graphs in FIGS. 5 and 6, respectively, are illustrated. The median resistance of the conventional ohmic contacts is approximately 0.75 Ohm·mm with the highest resistance at 2.69 Ohm·mm. The median resistance for the ohmic contacts formed according to the process disclosed herein is less than 0.5 Ohm·mm and the highest resistance is only 1.72 Ohm·mm. The over 33% reduction in median resistance is a surprising result that could not be predicted before the experiments were run.

Figure 9:
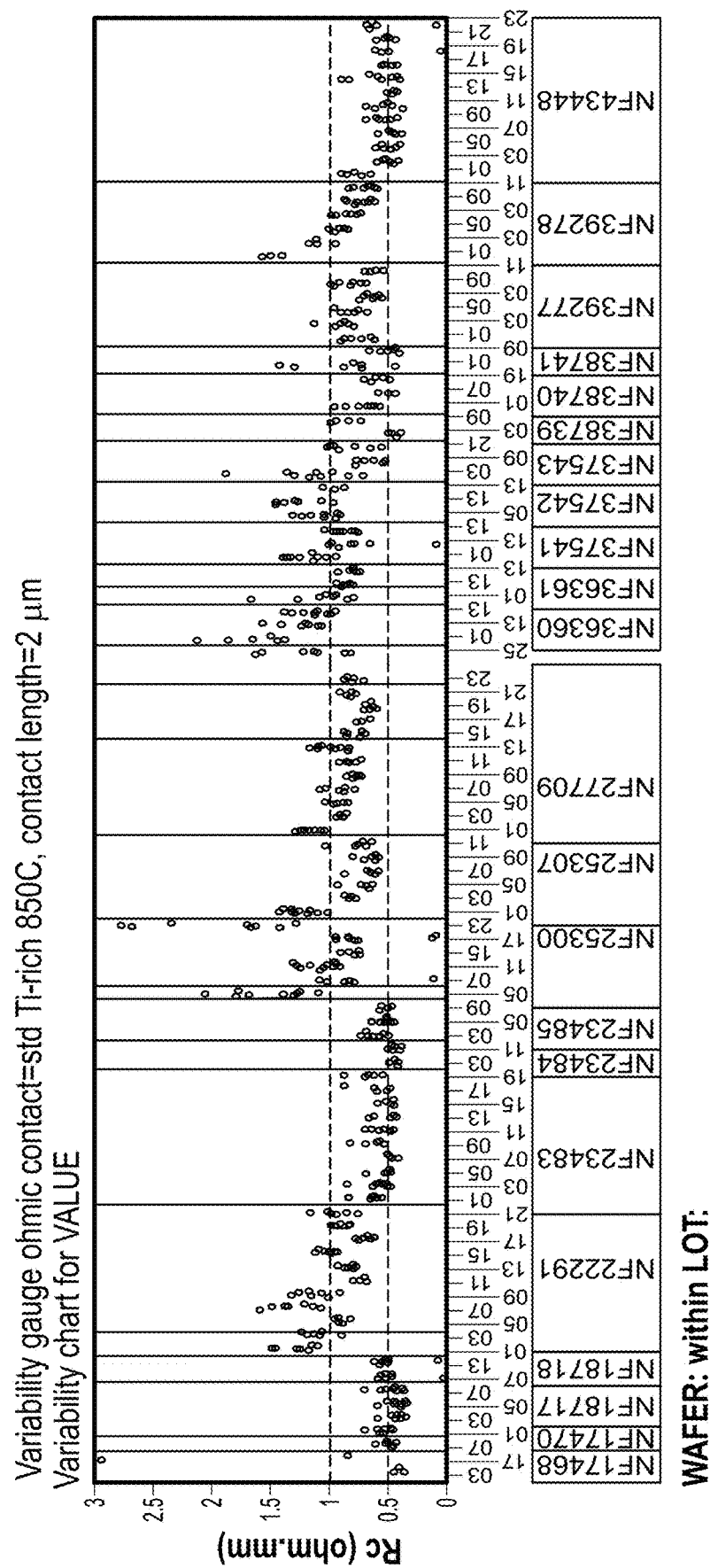
FIG. 9 is a graph illustrating the resistance of conventional ohmic contacts (2 µm length) across several lots of semiconductor wafers.
Figure 10:
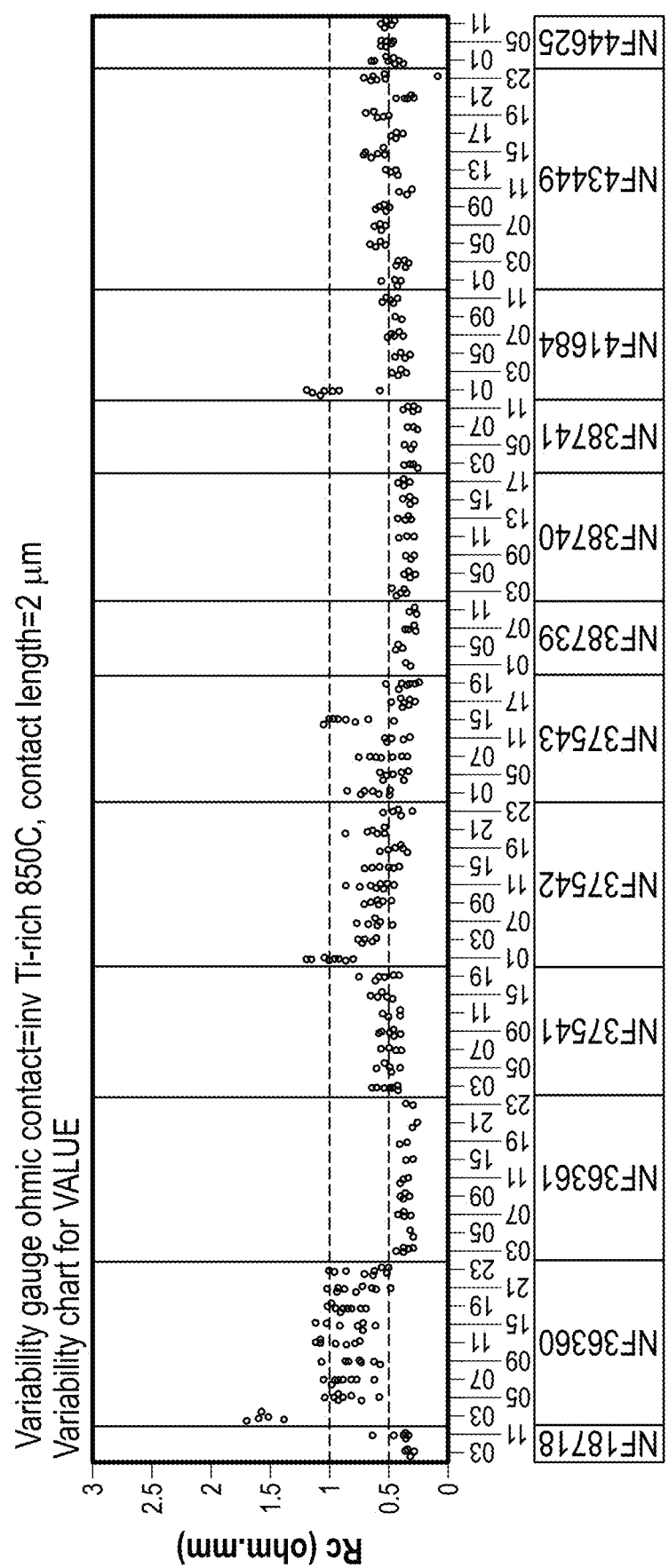
FIG. 10 is a graph illustrating the resistance of an implementation of ohmic contacts (2 µm length) formed using the metal configurations disclosed herein across several lots of semiconductor wafers.
Figure 11:
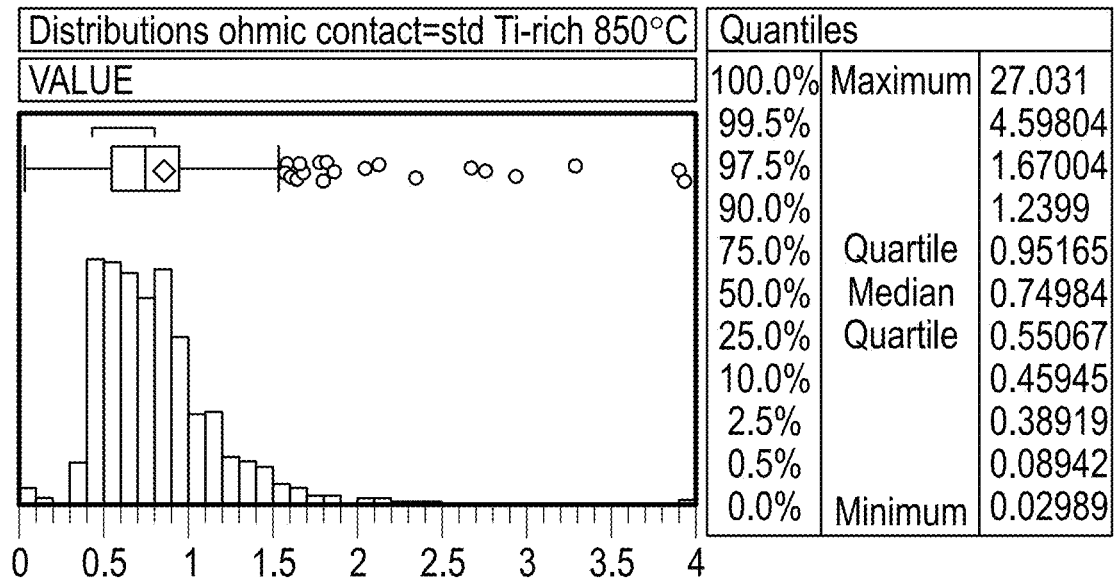
FIG. 11 is a histogram of the graph in FIG. 9.
Figure 12:
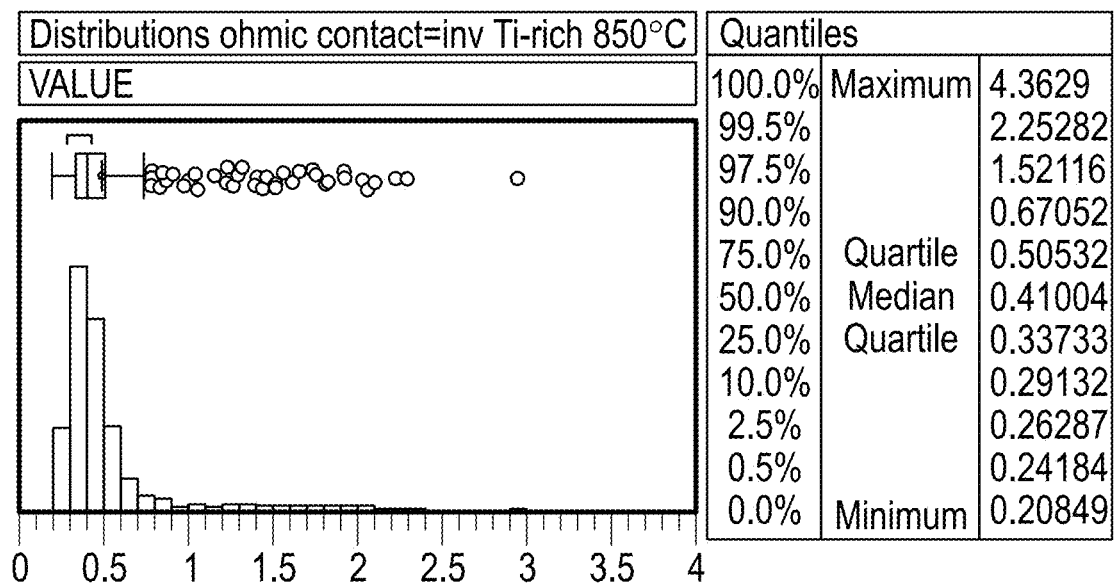
FIG. 12 is a histogram of the graph in FIG. 10.

Referring to FIGS. 9 and 10, graphs of the contact resistance ($R_c$) of 2 μm length ohmic contacts by wafer within lots is illustrated. The resistance of conventional (std) ohmic contacts is illustrated in FIG. 9 and the resistance of the ohmic contacts formed using the principles disclosed in this document is illustrated in FIG. 10. Referring to FIGS. 11 and 12, histograms of the wafer level data from the graphs in FIGS. 9 and 10, respectively, are illustrated. The observed median resistance of the conventional ohmic contacts is approximately 0.75 Ohm·mm with the highest resistance at 27.03 Ohm·mm. The median resistance for the other ohmic contacts is less than 0.5 Ohm·mm and the highest resistance is only 4.36 Ohm·mm. This observed over 33% reduction in median resistance is again a surprising result that was not predictable before the experiments were conducted.

Figure 13:
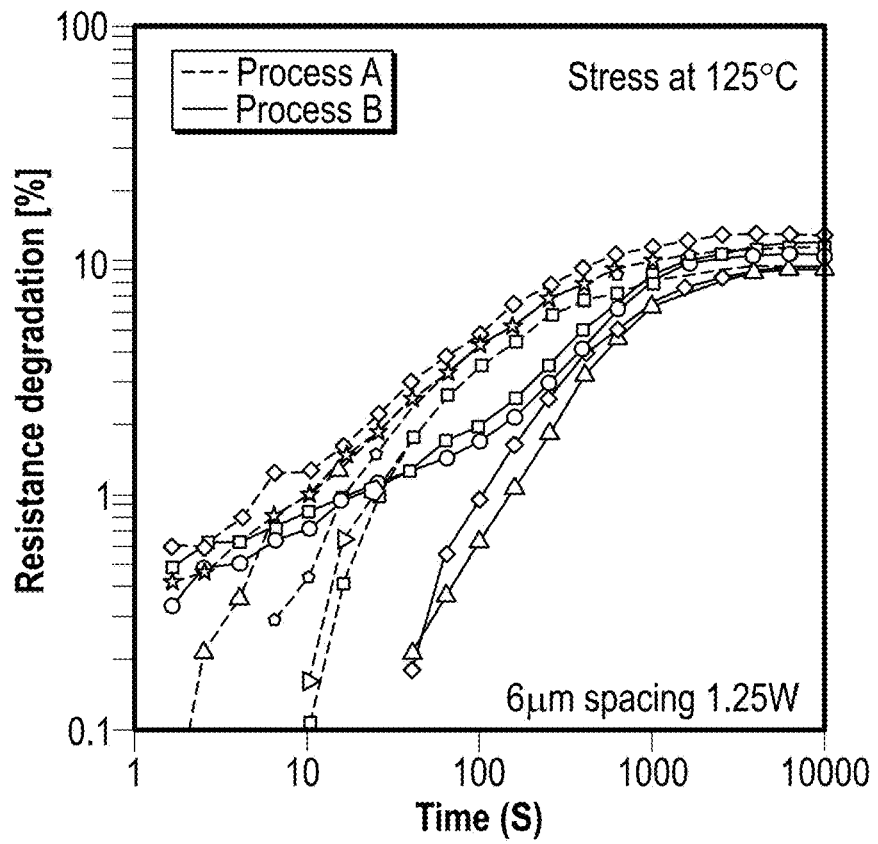
FIG. 13 is a graph comparing resistance degradation of conventional ohmic contacts and implementations of ohmic contacts like those disclosed herein under constant power stress.

Referring to FIG. 13, a graph showing the degradation of contact resistance (how contact resistance increases over time) under a constant power stress is illustrated. Process A is a conventional ohmic contact metal stack and Process B is an implementation of an ohmic contact having a metal stack like that disclosed herein. As seen in Table 1 below, the average contact resistance in Ohm·mm for Process A is 0.60±15% compared with 0.45±10% for Process B. Process B has a lower contact resistance and slower resistance degradation than Process A. In view of the data for Process, B, the time to failure will increase for devices using metal stack ohmic contacts like those disclosed in this document. This is because the degradation is retarded with Process B because of lower contact resistance. This same performance increase occurs while the 2 dimensional electron gas (2DEG) sheet resistance remains essentially identical to that for the conventional ohmic metal stack.

TABLE 1

| Process 1 | Average contact resistance [Ω · mm] | Average 2DEG sheet resistance [Ω/.mm] |
|---|---|---|
| A (Standard stack) | 0.60 ± 15% | 445 ± 2% |
| B (New stack) | 0.45% ± 10% | 444 ± 3% |

Figure 14:
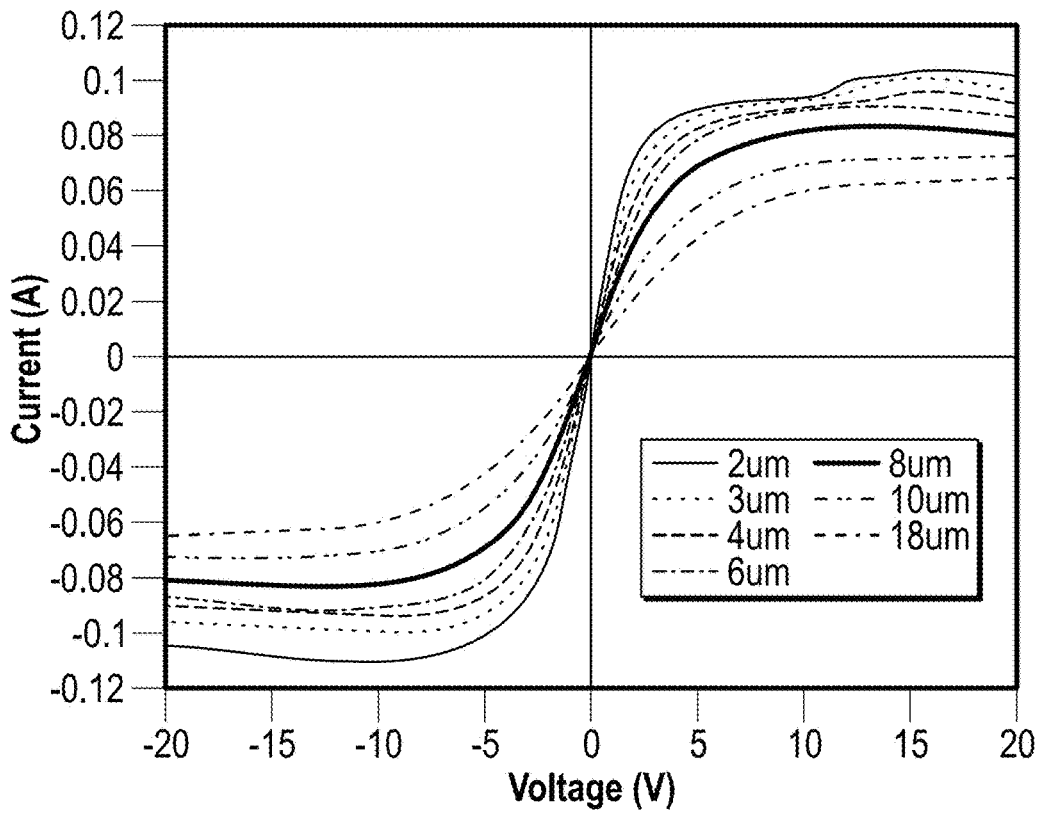
FIG. 14 is a graph illustrating the current-voltage characteristics for different spacing of conventional ohmic contacts.
Figure 15:
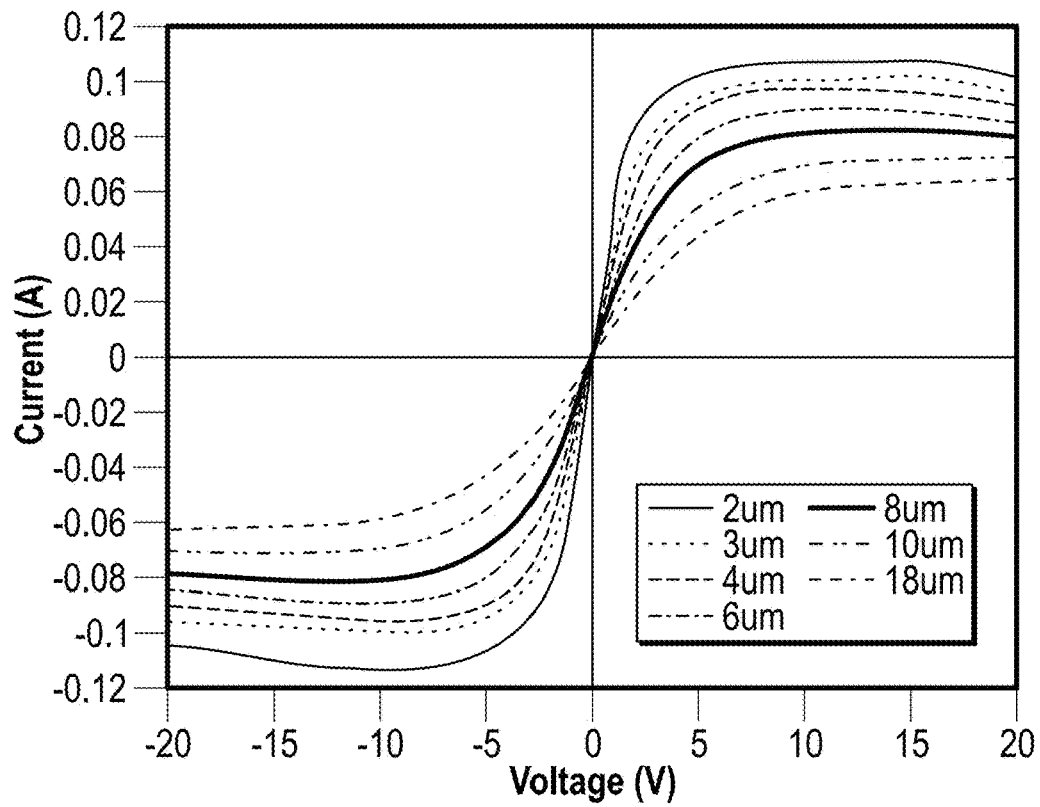
FIG. 15 is a graph illustrating the current-voltage characteristics for different spacing of implementations of ohmic contacts formed using the metal configurations disclosed herein.

Referring to FIGS. 14 and 15, graphs showing the current voltage characteristics for different contact spacings at room temperature is illustrated. The characteristics of conventional ohmic stack contacts are illustrated in FIG. 14. The characteristics of implementations of ohmic contacts like those disclosed herein are illustrated in FIG. 15. While the performance of the new ohmic contacts roughly tracks that of the conventional ohmic contacts, the results are unexpectedly better in comparison.

Figure 16:
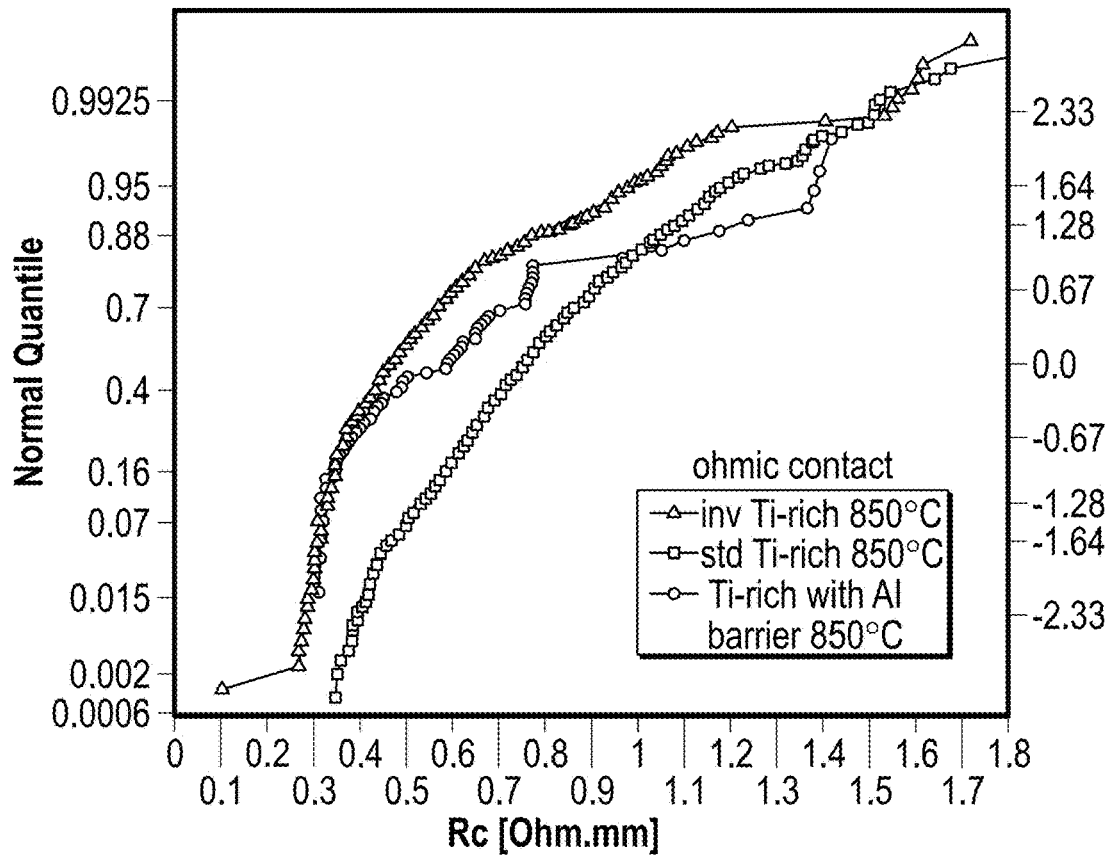
FIG. 16 is a normal quantile plot of ohmic contact resistance for contacts having a 100 µm length for conventional ohmic contacts and implementations of ohmic contacts like those disclosed herein.

Referring to FIG. 16, a normal quantile plot of ohmic contact resistance for contacts with 100 μm length processed with a conventional ohmic stack and stacks like those disclosed herein is illustrated. As can be observed, the standard ohmic contract has a significantly higher contact resistance than either ohmic contacts that contain aluminum directly over the AlGaN layer (inv Ti-rich) or a fourth layer containing aluminum as previously disclosed (Ti-rich with Al barrier). These results show a consistent improvement in contact resistance over the standard process with either metal stack type.

In places where the description above refers to particular implementations of ohmic contacts and implementing components, sub-components, methods and sub-methods, it should be readily apparent that a number of modifications may be made without departing from the spirit thereof and that these implementations, implementing components, sub-components, methods and sub-methods may be applied to other ohmic contacts.

What is claimed is:

1. An ohmic contact for a gallium nitride (GaN) device comprising:
   a first layer comprising aluminum coupled directly with the GaN device;
   a second layer comprising titanium coupled over the first layer; and
   a third layer comprising an anti-diffusion material coupled with the second layer;
   wherein the ohmic contact comprises no more than four layers.

2. The ohmic contact of claim 1, wherein the GaN device comprises a passivation layer.

3. The ohmic contact of claim 1, wherein the GaN device comprises an AlGaN barrier.

4. The ohmic contact of claim 1, wherein the ohmic contact is formed by one of the group of: etching through a passivation layer; etching through the passivation layer and etching partly through a AlGaN barrier; etching through the passivation layer and etching fully through the AlGaN barrier; and any combination thereof.

5. The ohmic contact of claim 1, wherein the first layer comprises one of the group of elemental Al, aluminum copper (AlCu), aluminum silicon copper (AlSiCu), aluminum silicon (AlSi), aluminum copper tungsten (AlCuW), and any combination thereof.

6. The ohmic contact of claim 5, wherein the amount of any trace elements in the first layer is less than 5%.

7. The ohmic contact of claim 6, wherein the amount of any trace elements in the first layer is between 0.5% to 1%.

8. The ohmic contact of claim 1, wherein the first layer comprises a thickness between 50 nm and 300 nm.

9. The ohmic contact of claim 1, wherein the second layer has a thickness between 20 nm and 100 nm.

10. The ohmic contact of claim 1, wherein the second layer has a thickness of 40 nm.

11. The ohmic contact of claim 1, wherein a ratio of the thicknesses of the first layer and the second layer is lower than 3:1, respectively.

12. The ohmic contact of claim 1, wherein the third layer comprises one of the group of titanium nitride (TiN), tungsten (W), vanadium (V), platinum (Pt), molybdenum (Mo), nickel (Ni), and any combination thereof.

13. The ohmic contact of claim 1, further comprising a fourth layer coupled between the second layer and the third layer, the fourth layer comprising one of the group of elemental Al, aluminum copper (AlCu), aluminum silicon copper (AlSiCu), aluminum silicon (AlSi), aluminum copper tungsten (AlCuW), and any combination thereof.

14. The ohmic contact of claim 13, wherein the first layer has a thickness greater than 5 nm.

15. The ohmic contact of claim 14, wherein a combined thickness of the thickness of the first layer and a thickness of the fourth layer is between 50 nm and 300 nm.

16. The ohmic contact of claim 13, wherein a ratio of the combined thicknesses of the first layer and the fourth layer and the thickness of the second layer is less than 3:1, respectively.

17. An ohmic contact for a gallium nitride (GaN) device comprising:
   a first layer comprising aluminum coupled directly with the GaN device;
   a second layer comprising titanium coupled over the first layer;
   a third layer comprising an anti-diffusion material coupled over the second layer; and
   a fourth layer comprising aluminum coupled between the second layer and the third layer;
   wherein the ohmic contact comprises no more than four layers.

18. The ohmic contact of claim 17, wherein the GaN device comprises a passivation layer, wherein the passivation layer surrounds the ohmic contact.

19. The ohmic contact of claim 17, wherein a combined thickness of the thickness of the first layer and a thickness of the fourth layer is between 50 nm and 300 nm.

20. The ohmic contact of claim 17, wherein a ratio of the combined thickness of the first layer and the fourth layer and the thickness of the second layer is less than 3:1, respectively.

* * * * *